(12) United States Patent
Kon et al.

(10) Patent No.: US 11,264,248 B2
(45) Date of Patent: Mar. 1, 2022

(54) ETCHING METHOD AND SUBSTRATE PROCESSING APPARATUS

(71) Applicant: Tokyo Electron Limited, Tokyo (JP)

(72) Inventors: Yoshimitsu Kon, Miyagi (JP); Atsushi Uto, Miyagi (JP); Lifu Li, Miyagi (JP); Tomonori Miwa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 179 days.

(21) Appl. No.: 16/704,129

(22) Filed: Dec. 5, 2019

(65) Prior Publication Data

US 2020/0185229 A1 Jun. 11, 2020

(30) Foreign Application Priority Data

Dec. 6, 2018 (JP) .............................. JP2018-229304
Oct. 4, 2019 (JP) .............................. JP2019-183953

(51) Int. Cl.
*H01L 21/308* (2006.01)
*H01L 21/3065* (2006.01)
*H01L 21/67* (2006.01)

(52) U.S. Cl.
CPC ...... *H01L 21/3083* (2013.01); *H01L 21/3065* (2013.01); *H01L 21/3081* (2013.01); *H01L 21/67063* (2013.01)

(58) Field of Classification Search
CPC ......... H01L 21/027–0338; H01L 21/32; H01L 21/02071; H01L 21/32136–32137; H01L 21/67069; H01L 21/31138; H01L 21/31122; H01L 21/31116; H01L 21/3065–30655; H01J 2237/334–3348
See application file for complete search history.

(56) References Cited

U.S. PATENT DOCUMENTS

| 6,218,268 B1* | 4/2001 | Xia | C23C 16/401 |
| | | | 438/435 |
| 2017/0076945 A1* | 3/2017 | Hudson | H01L 21/31144 |
| 2017/0178899 A1* | 6/2017 | Kabansky | H01L 21/3081 |
| 2019/0096751 A1* | 3/2019 | Sato | H01L 21/76808 |

FOREIGN PATENT DOCUMENTS

| JP | 2001053062 A | * | 2/2001 | ........ H01L 21/31144 |
| JP | 2012-510164 | | 4/2012 | |
| JP | 2014-090022 | | 5/2014 | |
| WO | 2010/059868 | | 5/2010 | |

* cited by examiner

*Primary Examiner* — Jarrett J Stark
(74) *Attorney, Agent, or Firm* — IPUSA, PLLC

(57) ABSTRACT

A method of etching a substrate including an etching film and a mask formed on the etching film is provided. The mask includes a first pattern of a first recess having a first opening and a second pattern of a second recess having a second opening. The method includes etching the etching film to a predetermined depth; depositing a protective film on the mask after the etching; and etching the etching film after the depositing. The first opening is smaller than the second opening. As a result of the depositing, the first opening of the first pattern is clogged and the second opening of the second pattern is not clogged.

17 Claims, 19 Drawing Sheets

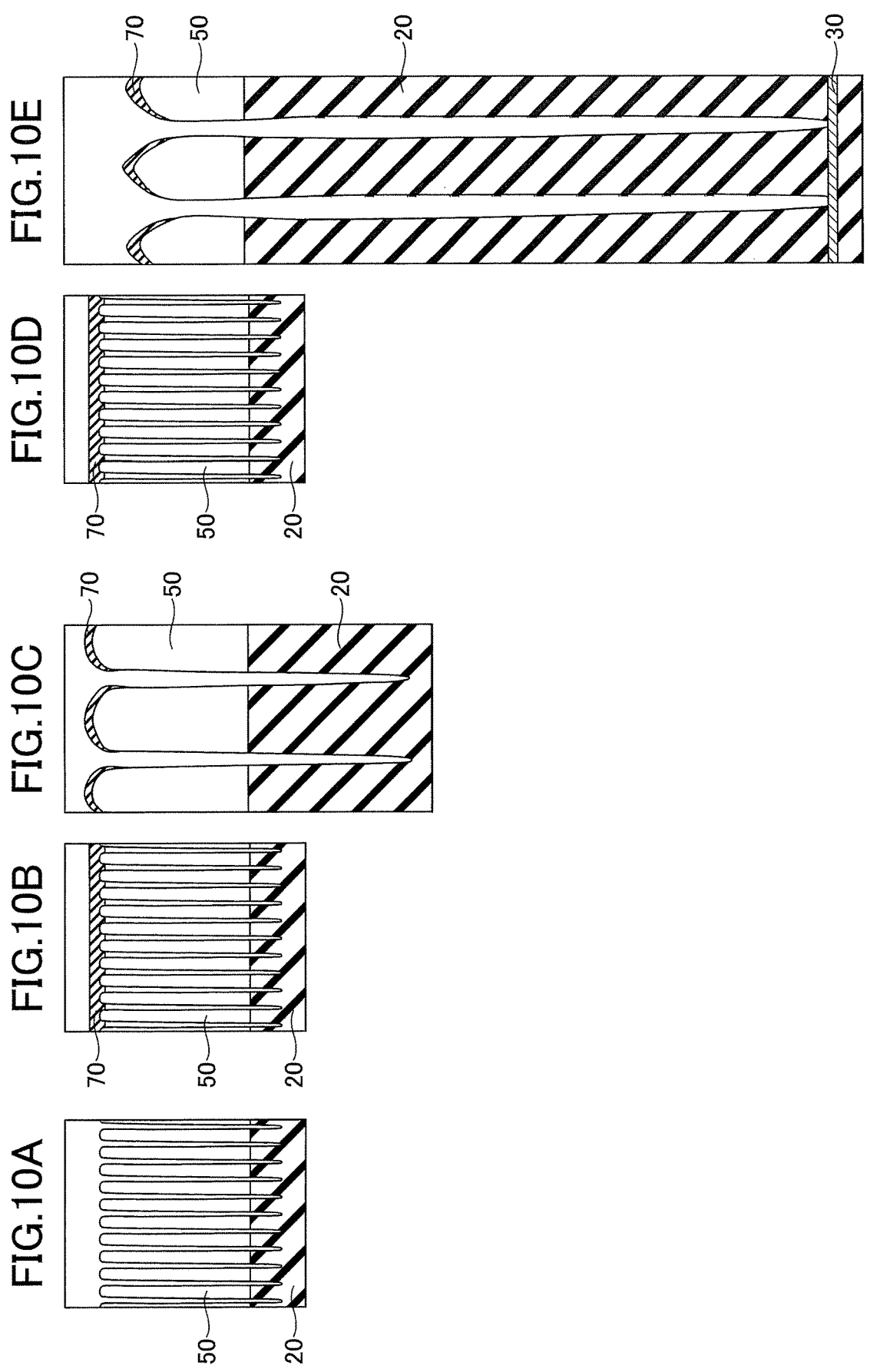

ETCHING METHOD AND SUBSTRATE PROCESSING APPARATUS

CROSS-REFERENCE TO RELATED APPLICATIONS

This patent application is based upon and claims priority to Japanese Patent Application No. 2018-229304 filed on Dec. 6, 2018, and Japanese Patent Application No. 2019-183953 filed on Oct. 4, 2019, the entire contents of which are incorporated herein by reference.

TECHNICAL FIELD

The present disclosure relates to an etching method and a substrate processing apparatus.

BACKGROUND

Patent Document 1 discloses a plasma processing method and a plasma processing apparatus capable of suppressing clogging of an opening of a hole when an oxide layer is etched.

Patent Document 2 discloses a technique for clogging an upper opening of a trench structure, in which a substrate is exposed to an etchant to form a sacrificial layer. In Patent Document 2, when the sacrificial layer is removed, a deformed cross-sectional shape of the trench is exposed. When a cross-sectional shape of the original trench is compared to the deformed trench, a relatively large amount of material is removed from the top of the trench structure so that the upper opening becomes wider and easier to embed in the implantation process.

CITATION LIST

Patent Document

[Patent Document 1] Japanese Laid-open Patent Application Publication No. 2014-090022

[Patent Document 2] Japanese National Publication of International Patent Application Publication No. 2012-510164

SUMMARY

The present disclosure provides an etching process method and substrate processing apparatus capable of controlling CD when an etching film is etched to different patterns of masks simultaneously.

According to one aspect of the present disclosure, a method of etching a substrate including an etching film and a mask formed on the etching film is provided. The mask includes a first pattern of a first recess having a first opening and a second pattern of a second recess having a second opening. The method includes etching the etching film to a predetermined depth; depositing a protective film on the mask after the etching; and etching the etching film after the depositing. The first opening is smaller than the second opening. As a result of the depositing, the first opening of the first pattern is clogged and the second opening of the second pattern is not clogged.

BRIEF DESCRIPTION OF THE DRAWINGS

FIGS. 10A to 10E are diagrams each illustrating a result of the etching process according to the embodiment;

DETAILED DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

[Substrate Processing Apparatus]

Figure 1:
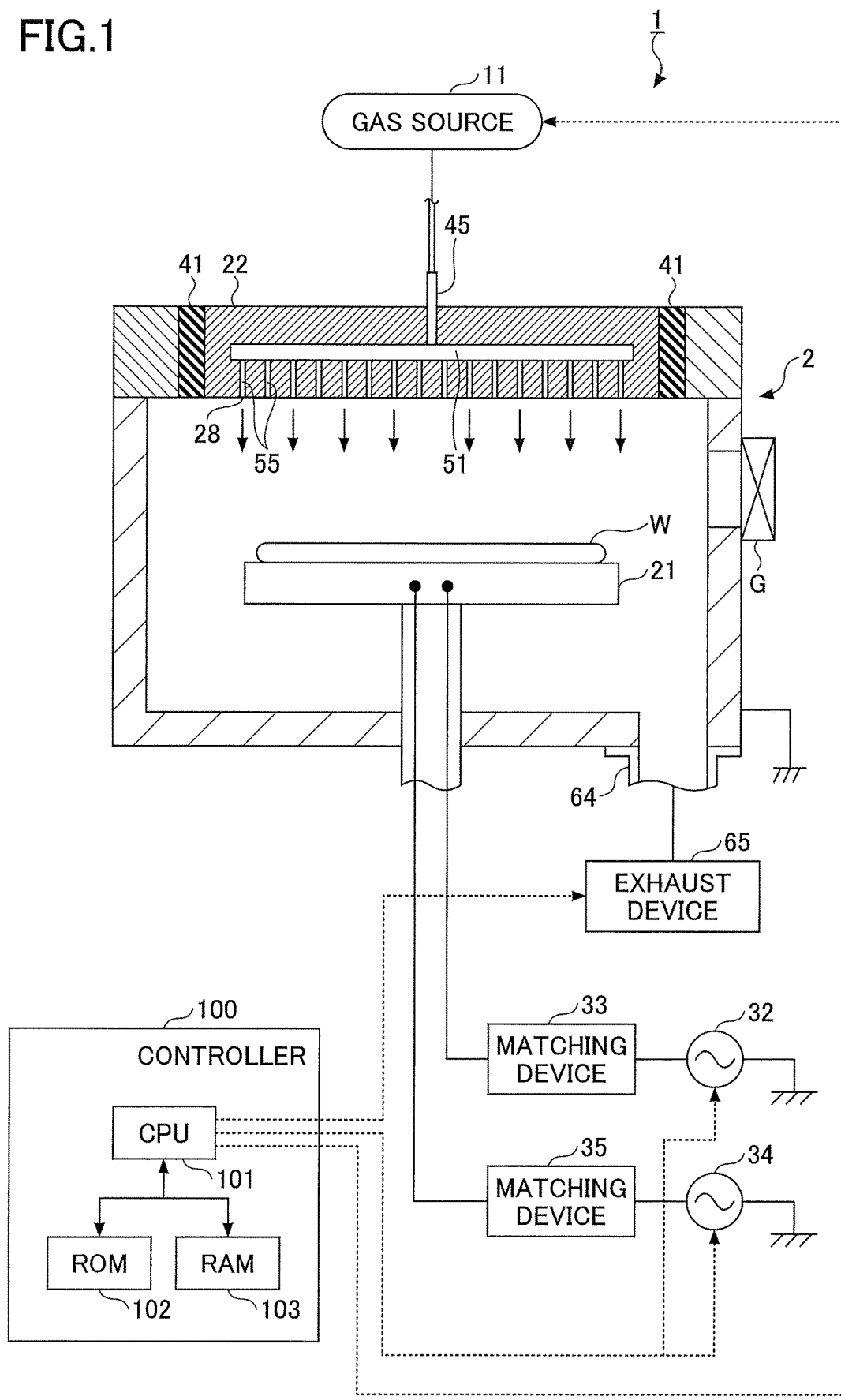
FIG. 1 is a longitudinal sectional view illustrating an example of a substrate processing apparatus according to an embodiment.

A substrate processing apparatus 1 according to an embodiment will be described with reference to FIG. 1. FIG. 1 is a cross-sectional view illustrating an example of a substrate processing apparatus 1 according to the present embodiment. Here, as an example of the substrate processing apparatus 1, a capacitively coupled plasma etching apparatus will be described.

The substrate processing apparatus 1 includes a chamber 2 made of conductive material such as aluminum, and a controller 100. The chamber 2 is electrically grounded. Inside the chamber 2, a lower electrode 21 and an upper electrode 22 facing the lower electrode 21 are provided. The lower electrode 21 also functions as a stage for placing a wafer W. The upper electrode 22 also functions as a showerhead that supplies a gas like a shower. A space between the lower electrode 21 and the upper electrode 22 is a processing space for processing the wafer W.

The lower electrode 21 is connected to a high frequency power supply 32 (may also be referred to as a radio frequency power supply 32) via a matching device 33. The lower electrode 21 is also connected to a high frequency power supply 34 (may also be referred to as a radio frequency power supply 34) via a matching device 35. The high frequency power supply 32 applies, to the lower electrode 21, radio frequency electric power HF for plasma generation of a frequency range between 40 MHz and 100 MHz for example. The high frequency power supply 34 applies, to the lower electrode 21, radio frequency electric power LF for attracting ions having a frequency less than that of the radio frequency electric power HF (less 40 MHz), such as 400 KHz to 13 MHz.

The matching device 33 causes output impedance of the high frequency power supply 32 to match load impedance. The matching device 35 causes output impedance of the high frequency power supply 34 to match load impedance. By the matching devices 33 and 35, the output impedance and load impedance apparently become identical for each of the high frequency power supply 32 and the high frequency power supply 34, while a plasma is generated in the chamber 2.

The upper electrode 22 is attached to a ceiling of the chamber 2 via a shield ring 41 of an insulating member that covers a periphery of the upper electrode 22. The upper electrode 22 is provided with a gas inlet 45 for introducing gas from the gas source 11. The gas output from the gas source 11 is fed to a diffusion chamber 51 via the gas inlet 45, and the gas is supplied to a processing space through gas flow passages 55 and gas holes 28.

An exhaust device 65 is attached to a bottom of the chamber 2 via an exhaust port 64. The exhaust device 65 evacuates the interior of the chamber 2 to maintain a predetermined quality of vacuum. On a side wall of the chamber 2, a gate valve G is provided, and a wafer W is loaded into the chamber 2 or unloaded from the chamber 2, in accordance with opening and closing of the gate valve G.

The substrate processing apparatus 1 is provided with a controller 100 that controls an entire operation of the substrate processing apparatus 1. A CPU 101 in the controller 100 performs plasma processing such as etching, in accordance with a recipe stored in a memory such as a ROM 102 and a RAM 103. The recipe may include process time, pressure (gas exhaust), magnitude of high frequency power, voltage, and various gas flow rates, which are control information of the substrate processing apparatus 1 with respect to a process condition. The recipe may also include a temperature in the chamber (upper electrode temperature, chamber side wall temperature, wafer W temperature, electrostatic chuck temperature, etc.), a temperature of the coolant output from a chiller, and the like. The recipe may be stored on a hard disk or a semiconductor memory. The recipe may also be stored in a portable computer-readable storage medium such as a CD-ROM or a DVD, and the portable computer-readable storage medium storing the recipe may be set to a predetermined location so that the recipe can be read out from the portable computer-readable storage medium.

[Example of Conventional Process]

The etching film may be etched into different patterns and different depths using the aforementioned substrate processing apparatus 1. An example of a conventional etching process etching into different patterns and different depths will be described with reference to FIGS. 2A to 2F.

Figure 2A:
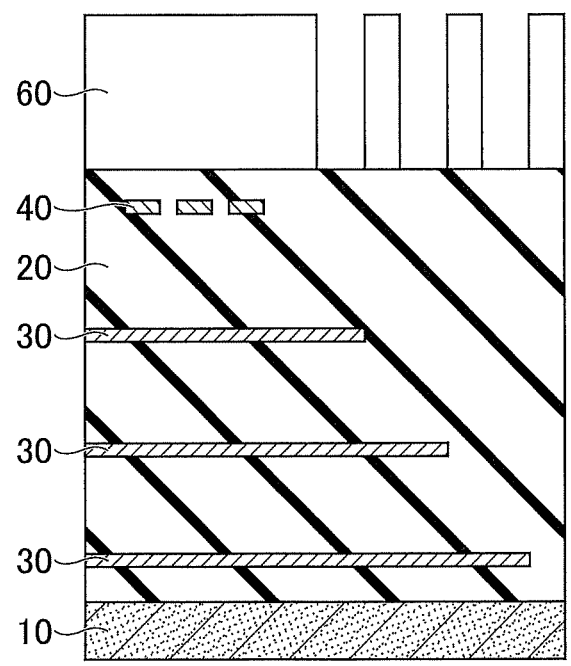
FIGS. 2A to 2F illustrate an example of a conventional process when different patterns are etched.

First, as illustrated in FIG. 2A, a wafer W having a silicon substrate 10 and an etching film 20 formed on the silicon substrate 10, which is covered with a mask 60 having a predetermined pattern is prepared. In the etching film 20, two types of etching stop layers 30 and 40 are provided.

The etching stop layer 40 is disposed at a position shallower than the etching stop layer 30, and is spaced apart from three portions at the same height. The three etching stop layers 30 are each provided at different positions in a height direction, and all of the three etching stop layers 30 are disposed at positions deeper than the etching stop layer 40. A length of an etching stop layer 30 positioned deeper than another etching stop layer 30 is longer than a length of the another etching stop layer 30, and end portions of the etching stop layers 30 form a terraced structure.

Figure 2B:
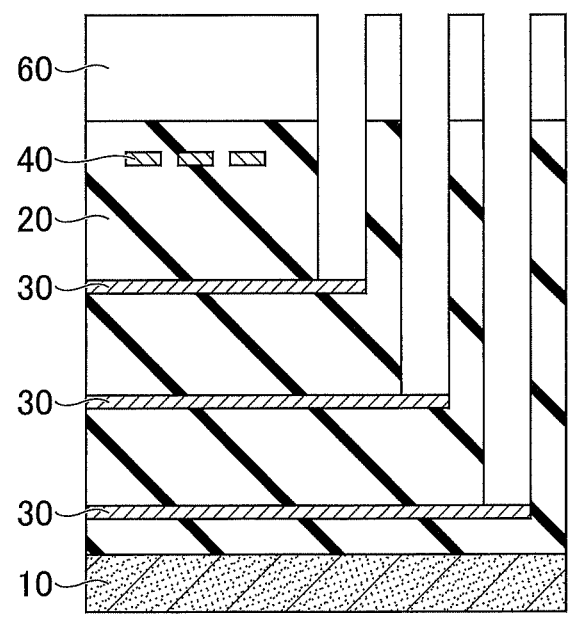

In the conventional process, etching is performed as illustrated in FIG. 2B, such that the etching film 20 on the side of the etching stop layer 40 is prevented from being etched, by the mask 60 illustrated in FIG. 2A, and that the etching is stopped at depth corresponding to each of the etching stop layers 30. This creates holes in the etching film 20 such that depth of each of the holes becomes shallower than that of any other holes positioned on its right side in FIG. 2A.

Figure 2C:
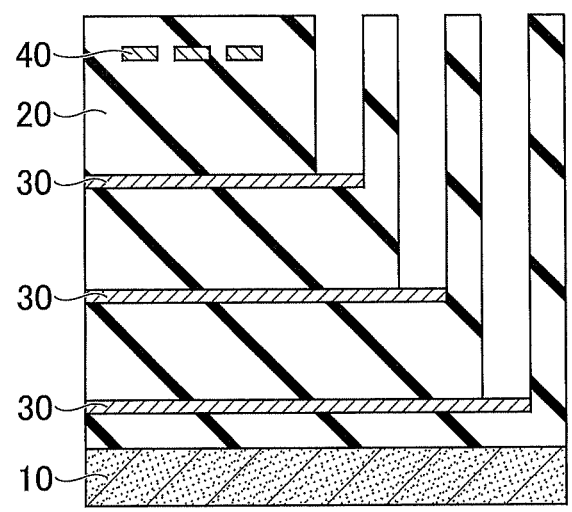
Figure 2D:
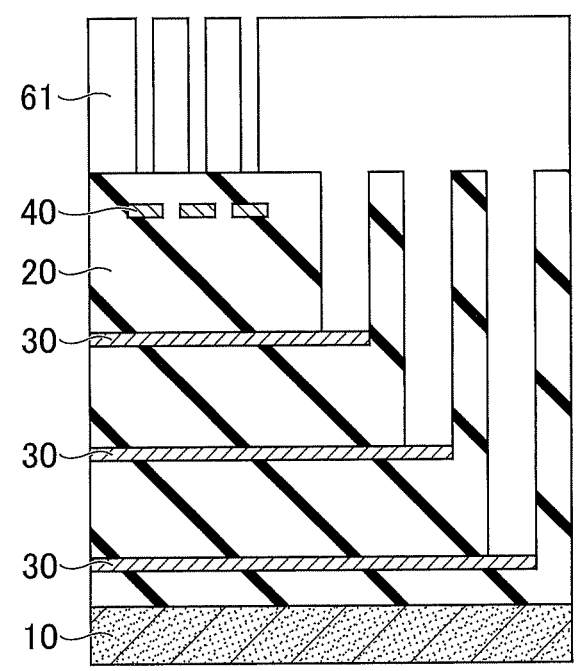
Figure 2E:
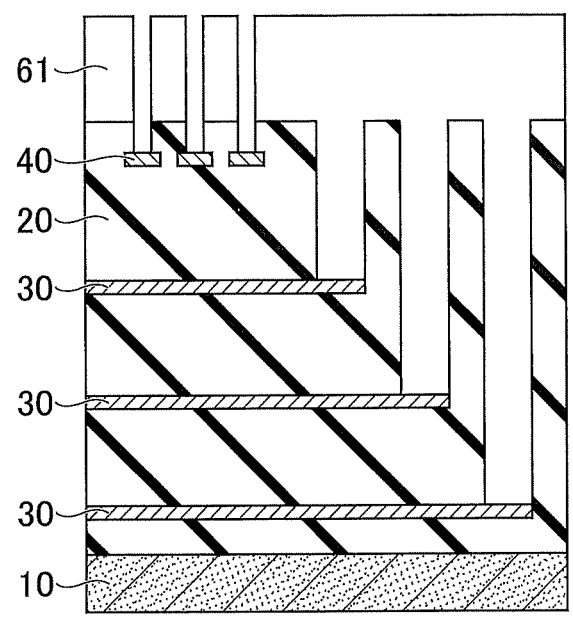
Figure 2F:
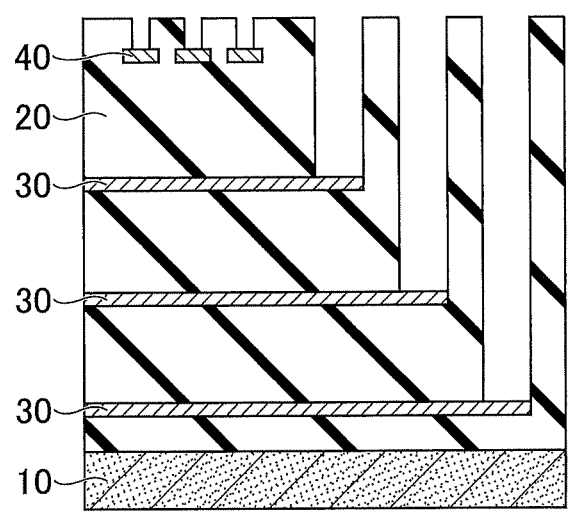

Then, as illustrated in FIG. 2C, the mask 60 is removed by ashing, and the wafer W is cleaned. Next, as illustrated in FIG. 2D, the etching film 20 is covered with a mask 61 in which a pattern is formed on the side where the etching stop layer 40 is disposed, and etching is performed. Etching is stopped at depth where the etching stop layer 40 is disposed, as illustrated in FIG. 2E. Next, as illustrated in FIG. 2F, the mask 61 is removed by ashing, and the wafer W is cleaned.

As described above, in the conventional process, etching of patterns each having a different size is performed in each of the patterns, the number of steps increases and it requires a long process time. Therefore, it is desirable to reduce costs by reducing process time and man-hours. In order to reduce process time and man-hours, etching of different patterns being performed simultaneously might be considered.

Figure 3:
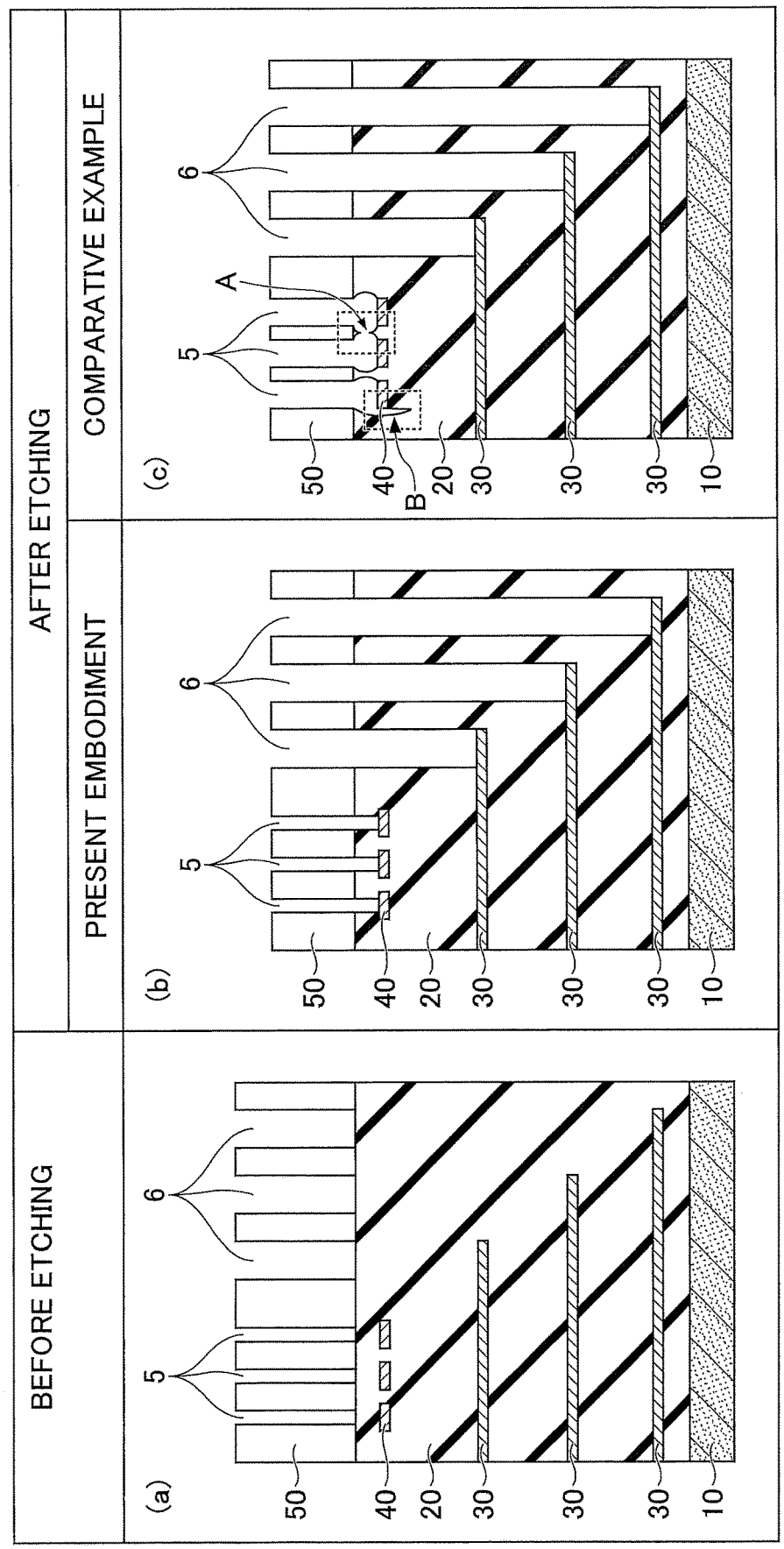
FIG. 3 is a diagram illustrating a comparison between an etching method in the embodiment and an etching method in a comparative example when an etching film is etched in different patterns.

For example, as illustrated in a diagram (a) of FIG. 3, a mask 50 having a pattern 5 for fine holes and a pattern 6 for large holes is formed, and the etching film 20 is etched in the patterns 5 and 6. However, in this method, after depth of fine holes formed above the etching stop layer 40 reaches the etching stop layer 40, the fine holes are over-etched, until depth of large holes reaches the etching stop layer 30 and etching terminates. As a result, as illustrated in the comparative example (diagram (c) in FIG. 3), adjacent fine holes may be connected with each other (see the area labeled as "A" in the diagram (c)), or the fine holes may be etched deeper from outside of the etching stop layer (see the area labeled as "B" in the diagram (c)). In such a case, critical dimension (CD) of each of the fine and large holes cannot be controlled according to their dimensions.

[Etching Process]

Thus, in the etching method according to the present embodiment, as illustrated in a diagram (b) of FIG. 3, the fine and large holes having different depth are etched simultaneously while controlling CD of each of the holes. Such an etching method is described with reference to FIGS. 4A to 4D. FIGS. 4A to 4D are diagrams illustrating respective steps of the etching method according to the present embodiment.

Figure 4A:
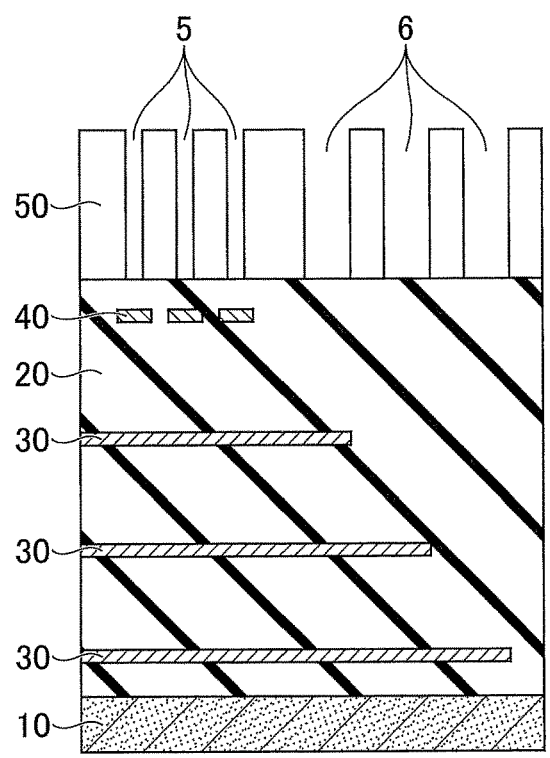
FIGS. 4A to 4D are diagrams illustrating respective steps of the etching method according to the embodiment.

As illustrated in FIG. 4A, a wafer W having a silicon substrate 10 and an etching film 20 formed on the silicon substrate 10, which is covered with a mask 50 having a predetermined pattern is prepared. In the etching film 20, two types of etching stop layers 30 and 40 are provided.

The mask 50 formed on the etching film 20 has a pattern 5 for fine holes and a pattern 6 for large holes. The pattern 5 for the fine holes is an example of a pattern of a recess of a first opening, and the pattern 6 for the large holes is an example of a pattern of a recess of a second opening. The first opening is smaller than the second opening. Each of the first opening and the second opening may be an opening for a hole or an opening for a line-like groove. If the first opening and the second opening are openings for holes, CD of the first opening and the second opening corresponds to a diameter of each the first opening and the second opening. If the first opening and the second opening are openings for grooves, CD corresponds to a width of each of the grooves. As arrangement of the etching stop layers 30 and 40 formed in the etching film 20 is the same as that of the etching stop layers 30 and 40 illustrated in FIG. 2A, the description thereof will not be repeated.

The mask 50 is an organic film. However, material of the mask 50 is not limited to an organic film, and may be a silicon-containing film such as a polysilicon film or a silicon oxide film, or may be a metal-containing film such as a titanium nitride film or tungsten. The etching film 20 is a silicon oxide film. However, material of the etching film 20 is not limited thereto, and may be a silicon-containing film, such as a polysilicon film, a silicon nitride film, or a layered film of a silicon oxide film and a silicon nitride film. The etching film 20 and the mask are made of materials that are different from each other, and a material having a mask selectivity not less than a predetermined value is adopted as the etching film 20. For example, in a case in which the etching film 20 is a silicon-containing film such as a silicon oxide film or a layered film of a silicon oxide film and a silicon nitride film, it is preferable that an organic film or a polysilicon film is selected for the mask 50. Also, in a case in which the etching film 20 is a polysilicon film, it is preferable that a silicon oxide film is selected for the mask 50.

The etching stop layer 40 may be formed, for example, from polysilicon. The etching stop layer 30 may be formed, for example, from tungsten. In the present embodiment, the etching stop layers 30, 40 function as electrodes, but are not limited thereto.

Figure 4B:
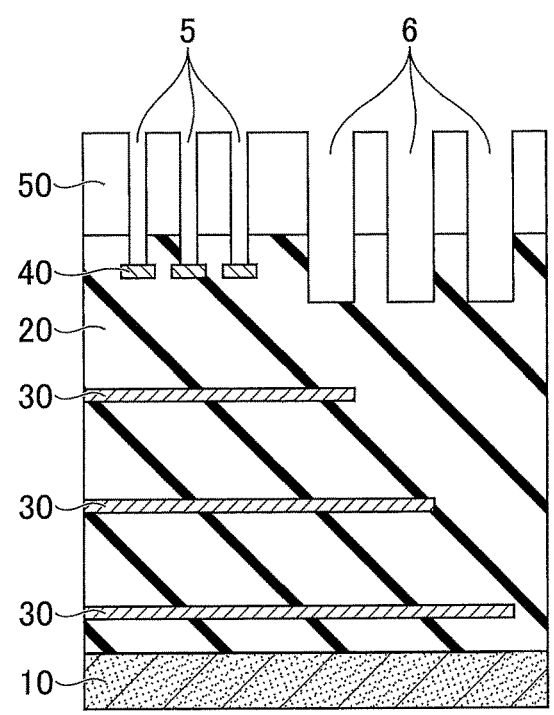
Figure 4C:
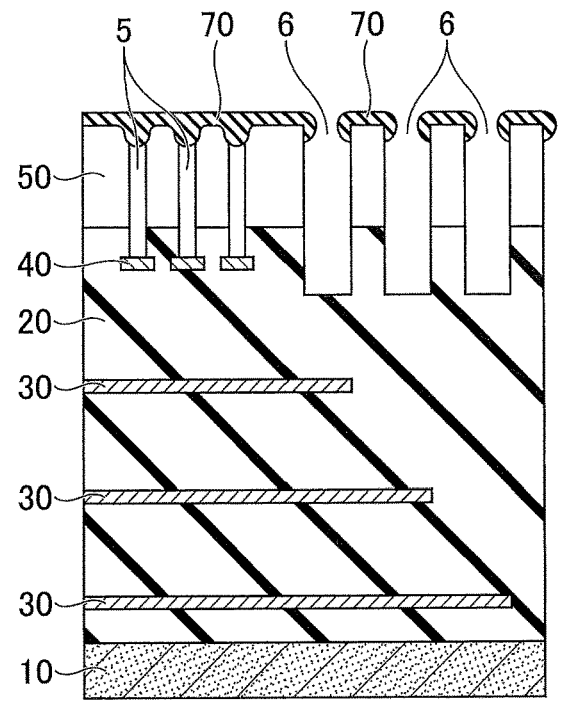
Figure 4D:
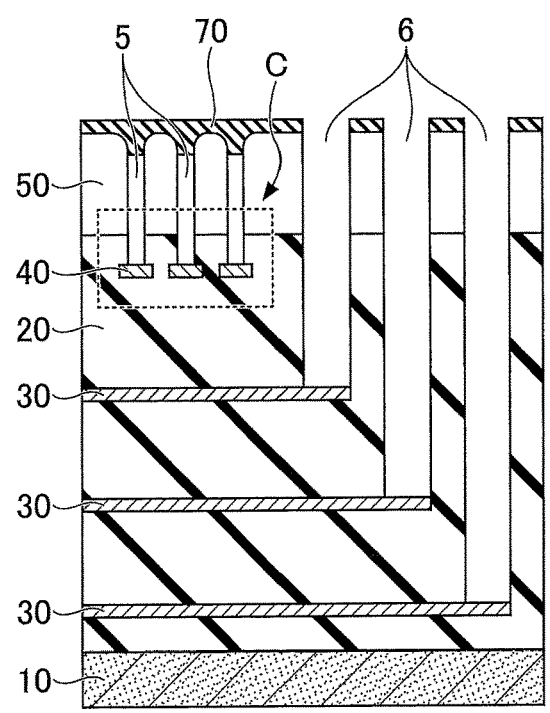

The etching method according to the present embodiment includes three steps: a first etching step illustrated in FIG. 4B, a deposition step illustrated in FIG. 4C, and a second etching step illustrated in FIG. 4D. These three steps will be described in order.

(First Etching Step)

In the first etching step, the etching film 20 is etched in the pattern 5 for the fine holes and the pattern 6 for the large holes, as illustrated in FIG. 4B. The first etching step etches the etching film 20 to a predetermined depth. The predetermined depth is an etching depth of the etching film 20 etched in the pattern 5 (for the fine holes) of the mask 50 in the first etching step. The first etching step etches the etching film 20 until the etching of the fine holes is stopped at the etching stop layer 40. Process conditions of the first etching step are as follows.

<Process Conditions>
High frequency power HF: 40 MHz, 1500 W
High frequency power LF: 3.2 MHz, 1500 W
Pressure: 30 mTorr (4.0 Pa)
Gas type: $C_4F_6$ gas, $O_2$ gas, Ar gas (Deposition Step)

After the first etching step, a deposition step of depositing a protective film 70 on the mask 50 is performed, as illustrated in FIG. 4C. The deposition step deposits the protective film 70 so as to clog an opening of the pattern 5 for the fine holes and not to clog an opening of the pattern 6 for the large holes. For example, in a case in which the patterns 5 and 6 are holes, the deposition step is controlled so that the following formula (inequality) (1) is established.

Figure 5:
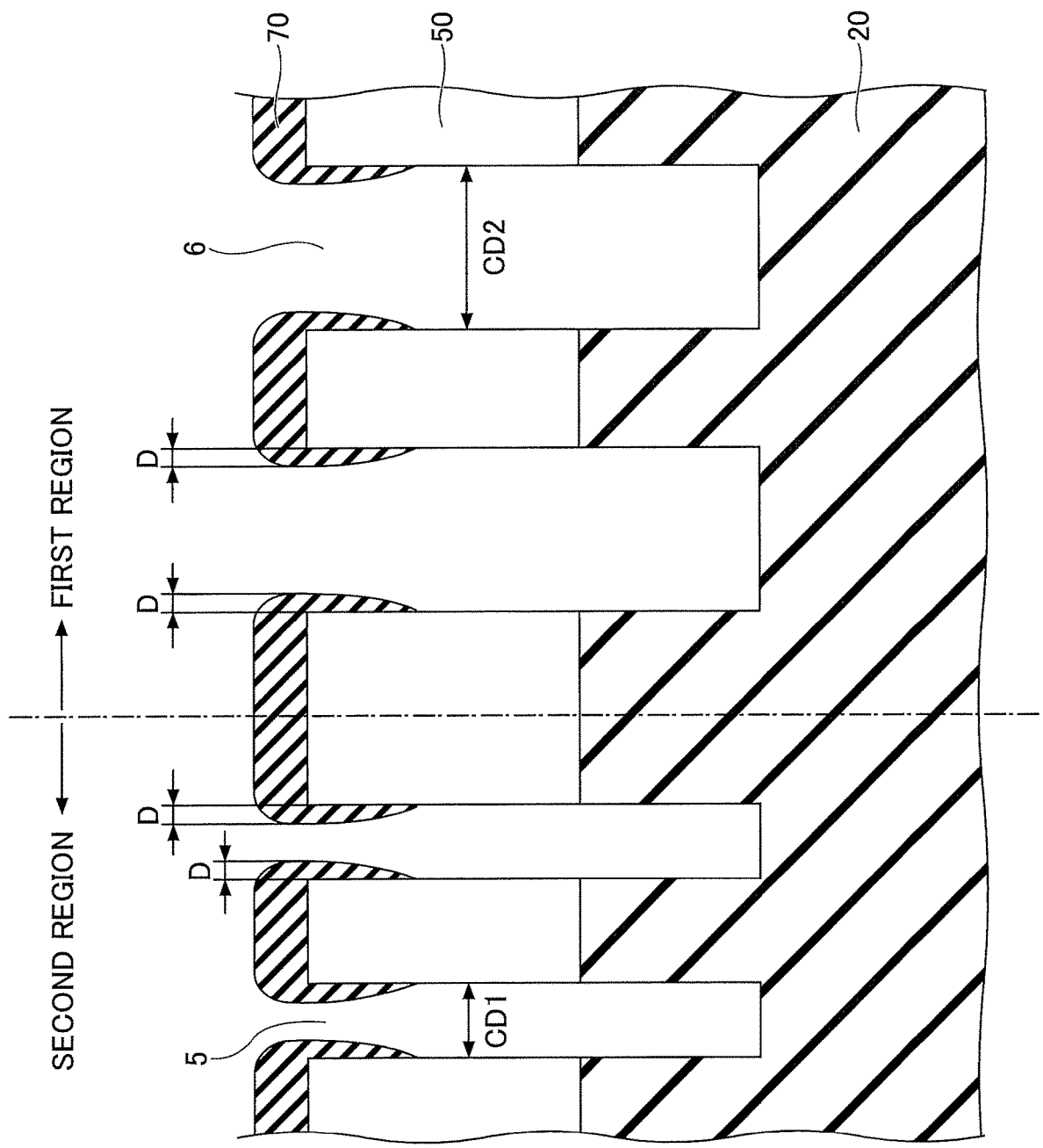
FIG. 5 is a diagram illustrating a deposition step according to the embodiment.

"Diameter of pattern 5 for small holes"≤2×
D<"diameter of pattern 6 for large holes"  (1), where D is a size (width) of the protective film 70 deposited on side walls of the patterns 5 and 6 of the mask 50 (see FIG. 5).

In a case in which the patterns 5 and 6 are grooves, the deposition step is controlled so that the following formula (inequality) (2) is established.

"Groove width of pattern 5 for small holes"≤2×
D<"groove width pattern 6 for large holes"  (2).

Process conditions of the deposition step are as follows.
<Process Conditions>
High-frequency power HF: 1500 W
High-frequency power LF: 4500 W
Pressure: 15 mTorr (2.0 Pa)
Gas type: $C_4F_6$ gas, $C_4F_8$ gas, $O_2$ gas, Ar gas However, types of gas to be used are not limited to the above-described gases, and a gas containing C and F may be used. Examples of gas containing C and F include fluorocarbon gas such as $C_4F_6$, $C_4F_8$, $C_5F_8$, and $C_6F_6$, and hydrofluorocarbon gas such as $CH_2F_2$ and $CH_3F$. In the deposition step, hydrocarbon gas such as $CH_4$, $C_2H_6$, $C_2H_4$, and $O_3H_6$ may be supplied. In addition, a gas containing 0 may be added. By controlling a flow rate of 0 in the gas, fine tuning of clogging of the pattern 5 is possible. Examples of oxygen-containing gas include $O_2$, CO, and $CO_2$.

(Second Etching Step)

In the second etching step, by etching the etching film 20 as illustrated in FIG. 4D, etching depth with respect to the pattern 6 for the large holes is made to be deeper. The second etching step etches the etching film 20 to respective depths of each of the etching stop layers 30. The second etching step etches the etching film 20 in the pattern 6 for the large holes, but does not etch the etching film 20 in the pattern 5 for the fine holes. Process conditions of the second etching step are as follows.

<Process Conditions>
High-frequency power HF: 1500 W
High-frequency power LF: 6000 W
Pressure: 30 mTorr (4.0 Pa)
Gas type: $C_4F_6$ gas, $C_3F_8$ gas, $O_2$ gas, Ar gas During the second etching step, the pattern 5 for the fine holes is clogged by the protective film 70. Thus, overetching of the holes is prevented, and occurrence of cases in which adjacent fine holes are connected with each other, and in which the fine hole is etched deeper from outside of the etching stop layer 40 is prevented (see A and B in the diagram (c) of FIG. 3). Therefore, the fine hole can be controlled to an appropriate CD value, as illustrated in FIG. 4D (see the area in the rounded corner labeled as "C").

The second etching step requires prevention of an accident in which the protective film 70 deposited during the second etching step is removed and in which the pattern 5 of the mask 50 is opened. Therefore, it is important that the protective film 70 deposited on the mask 50 in the deposition step has selectivity with respect to the etching film 20 in the second etching step. In other words, the protective film 70 is not limited to the organic film if the protective film 70 has selectivity with respect to the etching film 20 in the second etching step. For example, in a case in which the etching film 20 is a silicon-containing film such as a silicon oxide film or a layered film of a silicon oxide film and a silicon nitride film, it is desirable that an organic film or a silicon film is deposited as the protective film 70. In a case in which the etching film 20 is a polysilicon film, it is desirable that a silicon oxide film or a silicon nitride film is deposited as the protective film 70. Alternatively, a metal film such as tungsten may be deposited. In a case in which the protective film 70 other than an organic film is formed, for example, by using a silicon-containing gas and an additive gas as gases in the deposition step, a silicon-containing film such as a silicon oxide film or a silicon nitride film is formed as the protective film 70. In addition, a metal film such as a silicon film or tungsten may be formed by using sputtering technology.

Because etching in the pattern 6 for the large holes is performed in the second etching step, it is preferable that the protective film 70 is not formed at the bottom of the pattern 6 for the large holes in the deposition step. For this purpose, it is desirable that a shape of the protective film 70 formed in the deposition step is an overhung shape as illustrated in FIG. 4C, rather than a conformal shape. That is, compared to thickness of the protective film 70 deposited on the upper surface of the pattern 6 for the large holes and the upper side wall of the pattern 6 for the large holes, it is desirable that much less protective film 70 is formed at the bottom of the pattern 6 for the large holes, or it is desirable that the protective film 70 is not formed at the bottom of the pattern 6 for the large holes.

In order that the shape of the protective film 70 formed in the deposition step becomes an overhung shape, using a deposition precursor with a relatively high adsorption coefficient is effective. For example, among fluorocarbon and hydrocarbon gases exemplified as gases to be used in the deposition step, it is effective to use a high molecular gas such as $C_4F_6$, $C_6F_6$, and $CH_2F_2$, a gas with a high carbon content (e.g., a gas with a high ratio of carbon content to fluorine content), and a gas with an unsaturated bond.

A precursor is generated by dissociation from a gas by a plasma. In order to produce a precursor with a higher adsorption coefficient, it is preferable that the gas is in a higher molecular state, that is, in a state in which degree of dissociation is low. In this case, it is desirable to reduce the high frequency power HF for plasma generation or to increase a total flow rate of gas supplied to the processing space so that the residence time is shortened. It is also desirable to increase pressure, which is a process condition to shorten mean free path, in order to facilitate adsorption of the generated precursors to the upper surface and the upper side wall of the pattern 6 for the large holes.

If a thin protective film 70 is formed on the bottom of the pattern 6 for the large holes, the thin protective film 70 will be a hindrance in etching the etching film 20 in the pattern 6 for the large holes in the second etching step. Therefore, between the deposition step and the second etching step, a step of removing the protective film formed at the bottom of the pattern 6 for the large holes is inserted. The step may be performed under a different condition from that of the second etching step, or may be performed under the same condition. An example of a different condition from that of the second etching step is a condition in which an organic film can be removed by $O_2$ gas plasma. If the same condition is used as in the second etching step, the protective film 70 is also somewhat etched by the process condition of the second etching step. Therefore, until the protective film 70 formed at the bottom of the pattern 6 for the large holes is no longer present, this process corresponds to a step of removing the protective film, and the second etching step of etching the etching film 20 is performed continuously. In both cases, the protective film 70 is processed to an extent that the pattern 5 that has been clogged in the deposition step does not reopen.

If the step of removing the protective film 70 formed at the bottom of the pattern 6 for the large holes is inserted, processing time increases. Accordingly, it is desirable that, in the deposition step, the protective film 70 is not formed at the bottom of the pattern 6 for the large holes, or it is desirable that the protective film 70 formed at the bottom of the pattern 6 for the large holes in the deposition step is very thin, in order to avoid increase in processing time.

In order to avoid the pattern 5 of the mask 50 being opened during the second etching step, the deposition and second etching steps may be repeated a predetermined number of times. The predetermined number of times may be set in advance, and may be one or more times.

Note that, in the deposition step, a deposition rate is considered to be substantially the same regardless of a magnitude relationship between a CD value of the fine hole of the etching film 20 formed according to the pattern 5 of the mask 50 and a CD value of the large hole formed according to the pattern 6 of the mask 50.

By repeating the deposition and second etching steps a predetermined number of times, the pattern 5 of the mask 50 is prevented from being opened, or the pattern 5 can be clogged again even if the pattern 5 of the mask 50 opens.

[Adjustment of Parameters]

In the etching method according to the present embodiment, as illustrated in FIG. 5, the mask 50 includes, for example, a first region of a mask pattern in which the pattern 6 for the large holes is formed, and a second region of a mask pattern in which the pattern 5 for the fine holes is formed. By using the mask 50, the etching film 20 is etched simultaneously in different patterns, to form fine holes and large holes simultaneously. At this time, parameters are adjusted and a size (width) of deposited protective film 70 deposited on the sidewalls of the pattern of the mask 50 (which may be referred to as a "sidewall deposition amount" and is denoted by "D") is controlled such that CD (which may be denoted by "CD1") in the recess of the pattern 5 for the fine holes and CD (which may be denoted by "CD2") in the recess of the pattern 6 for the large holes satisfy the expression (inequality) of $CD1 \leq 2 \times D < CD2$. This allows the pattern 5 for the fine holes to be clogged and the pattern 6 for the large holes to not be clogged in the deposition step.

Figure 6A:
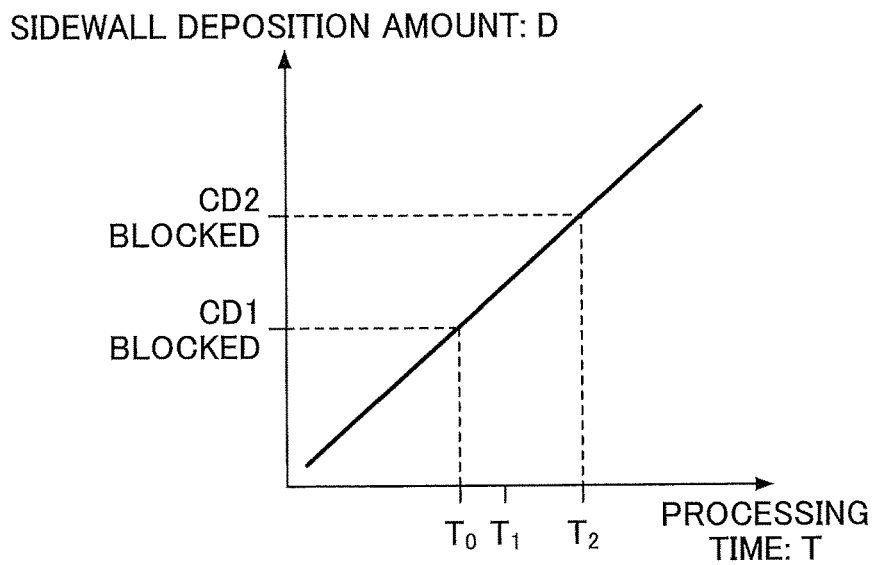
FIGS. 6A to 6C are graphs each illustrating a relationship between a deposition amount and a parameter.
Figure 6B:
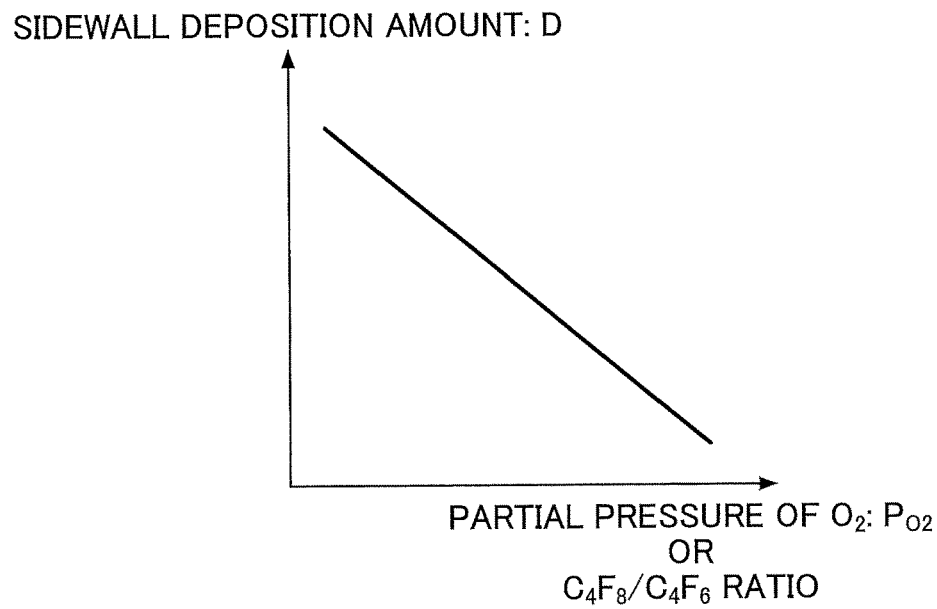
Figure 6C:
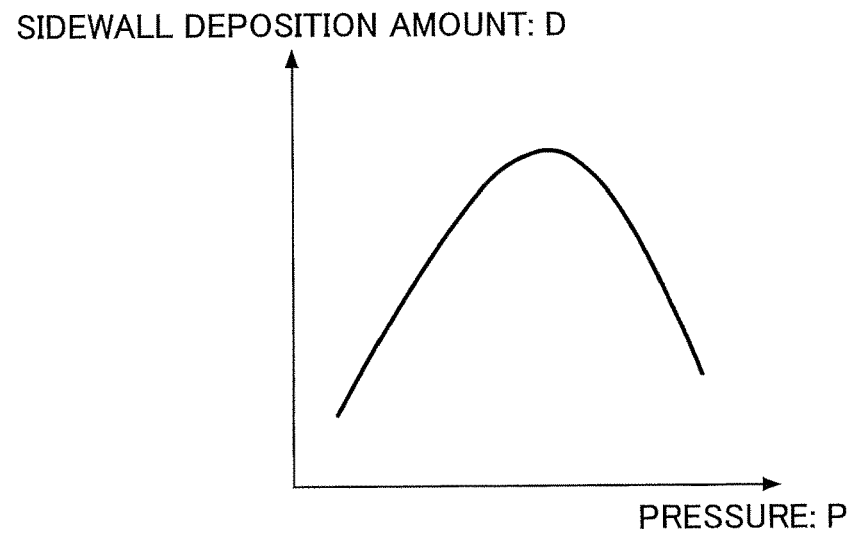

An example of a parameter that can be used in the etching method such that the expression $CD1 \leq 2 \times D < CD2$ can be established is illustrated in FIGS. 6A to 6C. FIGS. 6A to 6C are graphs each illustrating a relationship between a deposition amount (sidewall deposition amount D) and a parameter according to the present embodiment.

FIG. 6A is a graph illustrating an example of deposition amount (sidewall deposition amount D) of the side wall of the pattern of the mask 50 with respect to processing time T of the deposition step. FIG. 6B is a graph illustrating an example of the sidewall deposition amount D with respect to partial pressure $P_{O2}$ to an entire gas, or with respect to a flow rate ratio of $C_4F_8$ to $C_4F_6$. FIG. 6C is a graph illustrating an example of a sidewall deposit D for a pressure P in a chamber.

The example of FIG. 6A illustrates a case in which the sidewall deposition amount D reaches an amount that clogs CD1 illustrated in FIG. 5 when the processing time reaches $T_0$ and the amount of sidewall deposition D reaches an amount that clogs CD2 illustrated in FIG. 5 when the processing time reaches $T_2$. The controller 100 adjusts the processing time T of the deposition step to a range between $T_0$ and $T_2$ so that the above-described expression of $CD1 \leq 2 \times D < CD2$ is established. For example, the deposition step is controlled to be performed for a time equal to $T_0$ or longer and shorter than $T_2$. This allows the pattern 5 for the fine holes to be clogged and the pattern 6 for the large holes to not be clogged in the deposition step. The parameter used/ adjusted in the etching method according to the present embodiment is not limited to the processing time of the deposition step, but may be at least one of the partial pressure of $O_2$ gas to an entire gas, the flow rate ratio of $C_4F_8/C_4F_6$, or the chamber pressure.

Next, with respect to the shape of the patterns after the deposition shape, how the overhung shape and the conformal shape of the protective film 70 can be controlled by adjusting parameters will be described with reference to FIGS. 7A to 7E. FIGS. 7A to 7E are diagrams illustrating an overhung shape and relationship between adjustment of parameters according to the present embodiment and the overhung shape.

Figure 7A:
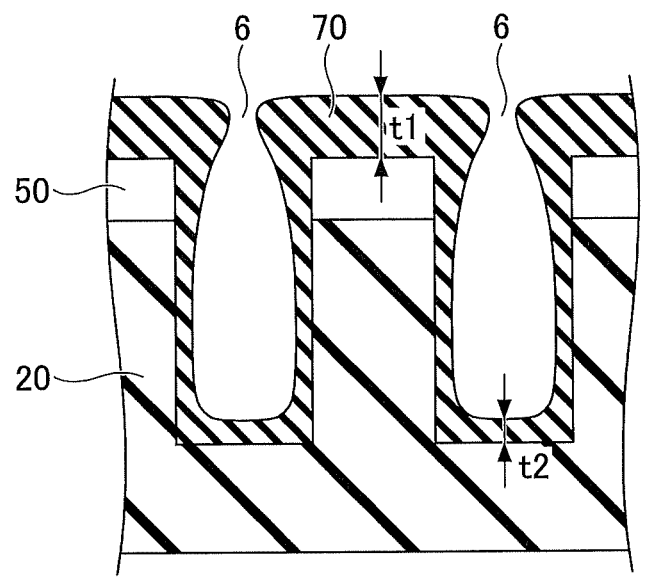
FIG. 7A is a diagram illustrating an overhung shape of a protective film.

As illustrated in FIG. 7A, let the thickness of the protective film 70 deposited on the upper surface of the mask 50 be t1, and let the thickness of the protective film 70 deposited on the bottom of the pattern 6 for the large holes be t2. As the protective film 70 at the bottom of the pattern 6 for the large holes becomes thicker, etch stop occurs. It is desirable that the protective film 70 is of overhung shape in order to avoid the etch stop. That is, compared to thickness of the protective film 70 deposited on the upper surface of the pattern 6 for the large holes and the upper side wall of the pattern 6 for the large holes, it is desirable that much less protective film 70 is formed at the bottom of the pattern 6 for the large holes, or it is desirable that the protective film 70 is not formed at the bottom of the pattern 6 for the large holes.

For example, from a state in which t1 is larger than t2 (t1>t2), as t1/t2 increases, the shape of the protective film 70 becomes an overhung shape. In contrast, as t1/t2 decreases and t1/t2 becomes closer to 1, the shape of the protective film 70 becomes a conformal shape. If the protective film 70 becomes overhung shaped, the etch stop is avoided, etching is smoothly performed, and etching time is shortened. Accordingly, in the present embodiment, the protective film 70 is controlled to an overhung shape by adjusting parameters.

Figure 7B:
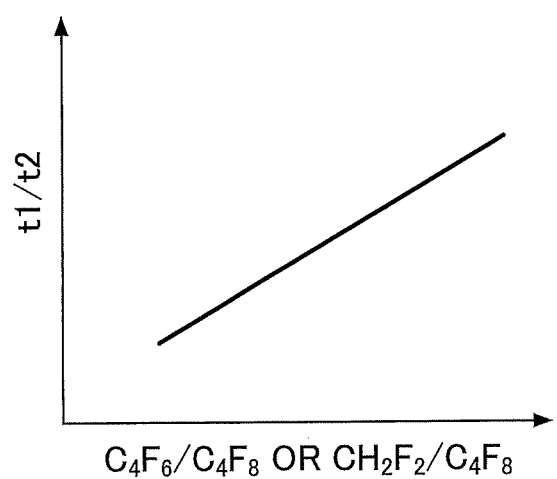
FIGS. 7B to 7E are graphs each illustrating a relationship between magnitude of a parameter and the overhung shape.
Figure 7C:
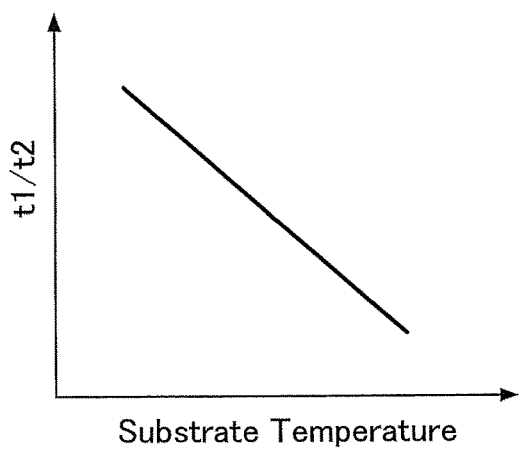
Figure 7D:
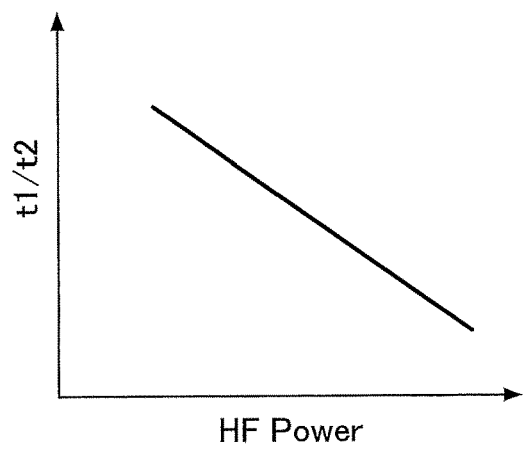
Figure 7E:

With respect to parameters used for controlling the shape of the protective film 70, FIG. 7B illustrates a case of controlling a ratio of gases, FIG. 7C illustrates a case of controlling a substrate temperature, FIG. 7D illustrates a case of controlling the high frequency power HF, and FIG. 7E illustrates a case of controlling a gas residence time.

Process conditions of the deposition step at this time are as follows.
<Process Conditions>
High frequency power HF: 1500 W
High frequency power LF: 4500 W
Pressure: 15 mTorr (2.0 Pa)
Gas type: $CH_2F_2$ gas, $C_4F_8$ gas, Ar gas
Substrate temperature 10° C.

As illustrated in FIG. 7B, as $CH_2F_2/C_4F_8$ increases, t1/t2 increases, so that the protective film 70 can be controlled to an overhung shape. In a case in which $C_4F_6$ is used instead of $CH_2F_2$, the same applies. As $C_4F_6/C_4F_8$ increases, t1/t2 increases, so that the protective film 70 can be controlled to an overhung shape. $CH_2F_2$ and $C_4F_8$ are examples of gas causing deposition easily, while $C_4F_8$ is an example of gas not causing deposition easily. In other words, a shape of the protective film 70 can be made to be closer to an overhung shape by increasing the flow rate of gas causing deposition easily relative to gas not causing deposition easily.

Further, as illustrated in FIG. 7C, as the substrate temperature decreases, t1/t2 increases, so that the protective film 70 can be controlled in an overhung shape. Further, as illustrated in FIG. 7D, as the high frequency power decreases, t1/t2 increases, so that the protective film 70 can be controlled in an overhung shape.

Further, as illustrated in FIG. 7E, as the residence time decreases, t1/t2 increases, so that the protective film 70 can be controlled in an overhung shape. This is because, if the residence time increases (i.e. if the gas is in the plasma generation space for a longer time), dissociation of the gas progresses, and the dissociated gas can easily move into the interior of the pattern 6 for the large holes. Thus, t1 decreases.

The control of the parameters of FIGS. 7B to 7E is related to an adsorption coefficient of a precursor. If the adsorption coefficient of the precursor is high, the precursor tends to adhere to an opening (upper surface and side wall of the upper portion) of the pattern 6 for the large holes, and an amount of the precursor adhering to the bottom is reduced accordingly. That is, if the adsorption coefficient of the precursor increases in accordance with the control of each parameter, t1 increases, an amount of the precursor adhering to the upper surface and the upper side wall of the pattern 6 for the large holes increases, and an amount of the precursor adhering to the bottom decreases. Conversely, if the adsorption coefficient of the precursor decreases in accordance with the control of each parameter, t1 decreases, the amount of the precursor adhering to the upper surface and the upper side wall of the pattern 6 for the large holes decreases, thereby increasing the amount of the precursor adhering to the bottom. As described above, by controlling at least one of the parameters illustrated in FIGS. 7B to 7E so as to increase the adsorption coefficient of the precursor, etch stop is avoided, and etching can be smoothly performed. It should be noted that the upper side wall of the pattern 6 for the large holes means a part of the side wall of the pattern 6 that is located substantially above the center of the side wall of the pattern 6.

The above-described control allows a deposition amount of the protective film 70 deposited in the deposition step at the bottom of a pattern of a recess corresponding to the pattern 6 for the large holes to be less or less than a deposition amount of the protective film 70 deposited on the upper surface and upper side walls of the pattern of the recess corresponding to the pattern 6.

Further, the above-described control allows the shape of the protective film 70 deposited on the side wall of the recess of the pattern 5 for the fine holes and deposited on the side wall of the pattern 6 for the large holes to be an overhung shape, such that the protective film 70 deposited on the substantially upper side relative to the center of the side wall is thicker than the protective film 70 deposited on the substantially lower side.

[Etching Method]

Figure 8:
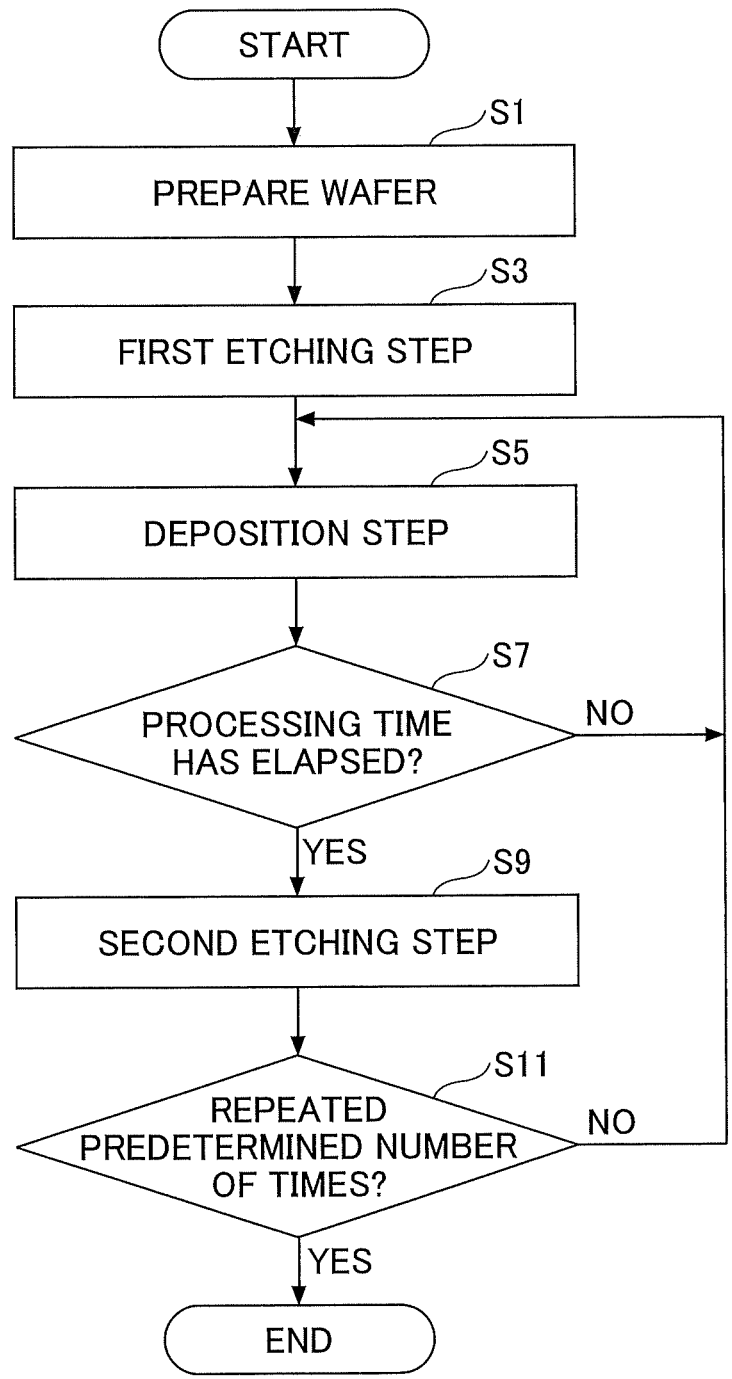
FIG. 8 is a flowchart illustrating an example of the etching process according to the embodiment.

Hereinafter, the etching method according to the present embodiment will be described with reference to FIG. 8, taking as an example adjusting of processing time of the deposition step. FIG. 8 is a flowchart illustrating an example of the etching method according to the present embodiment. The etching method in FIG. 8 is controlled by the controller 100.

When a process illustrated in FIG. 8 is started, the controller 100 prepares a wafer W, on which a mask 50 having a pattern 5 for fine holes and a pattern 6 for large holes is formed on an etching film 20, by loading the wafer W into the chamber 2 (step S1). Thus, the wafer W having the structure illustrated in FIG. 4A is placed on the stage (bottom electrode 21).

Next, in step S3, the controller 100 performs the first etching step. Thus, as illustrated in FIG. 4B, the etching film 20 is etched into the pattern 5 for the fine holes and the pattern 6 for the large holes, and the etching with respect to the pattern 5 for the fine holes is stopped by the etching stop layer 40.

Next, in step S5, the controller 100 performs the deposition step. Next, in step S7, the controller 100 determines whether or not a predetermined processing time has elapsed. For example, as illustrated in FIG. 6A, the controller 100 determines, as the predetermined processing time, a processing time $T_1$ that is within a range between time $T_0$ and time $T_2$ in advance, such that the above-described expression of CD1≤2×D<CD2 is established. If it is determined that time $T_1$ has not elapsed, the controller 100 repeats step S5 and step S7. In contrast, if it is determined that time $T_1$ has elapsed, the process proceeds to step S9. Thus, as illustrated in FIG. 4C, a protective film 70 is formed on the mask 50, which clogs the pattern 5 for the fine holes and does not clog the pattern 6 for the large holes.

Next, in step S9, the controller 100 performs the second etching step. Next, in step S11, the controller 100 determines whether or not steps S5 to S9 (the deposition step and the second etching step) have been repeated a predetermined number of times. If it is determined that steps S5 to S9 have not been repeated the predetermined number of times, the process reverts to step S5, and steps S5 to S9 are executed again. Meanwhile, in step S11, if it is determined that steps S5 to S9 have been repeated the predetermined number of times, the controller 100 terminates the process. Thus, as illustrated in FIG. 4D, the etching film 20 is etched in the pattern 6 for the large holes up to each etching stop layer 30.

In the above description, a deposition rate of the protective film 70 in the deposition step has been considered to be substantially the same regardless of magnitude relationship between the CD value of the fine hole of the etching film 20 and the CD value of the large hole of the etching film 20 that are formed in accordance with the patterns 5 and 6 of the mask 50. However, the deposition rate may vary depending on whether the shape of the patterns 5 and 6 of the mask 50 is vertical or tapered.

In such a case, the deposition step adjusts a parameter so that the following two expressions (inequalities) are established between the CD1 of a recess in the pattern 5 for the fine holes and the CD2 in the recess of the pattern 6 for the large holes.

$$CD1 \le 2 \times D1 \text{ and } 2 \times D2 < CD2,$$

where D1 is a deposition amount of the protective film 70 deposited on the side wall of the pattern 5 of the mask 50, and D2 is a deposition amount of the protective film 70 deposited on the side wall of the pattern 6 of the mask 50. This controls the deposition amount D1 and the deposition amount D2 of the protective film 70 deposited on the side walls of the patterns of the mask 50.

Figure 9:
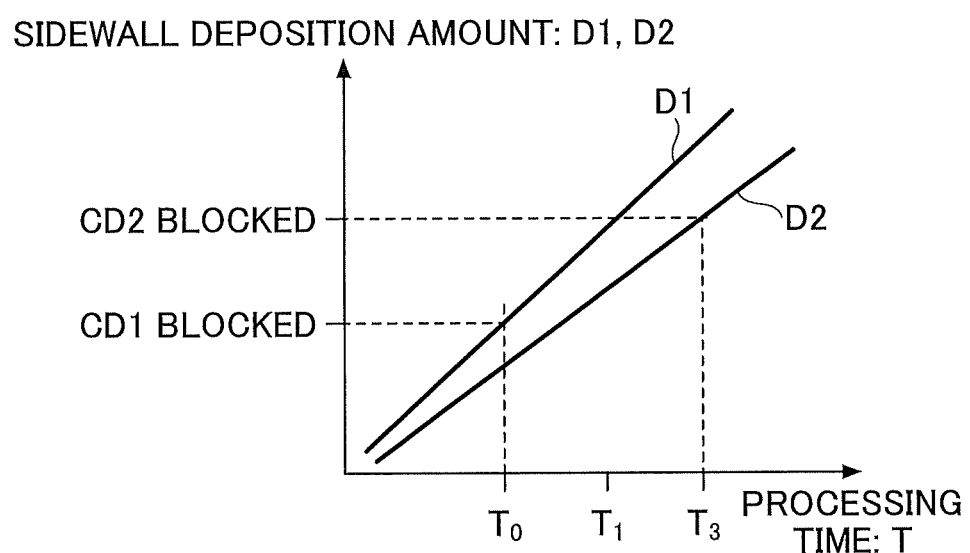
FIG. 9 is a graph illustrating examples of sidewall deposition amounts according to the embodiment.

In an example illustrated in FIG. 9, at a time when the processing time $T_0$ elapses, the deposition amount D1 reaches an amount such that the protective film 70 blocks CD1 (clogs the opening of the fine holes corresponding to the pattern 5), and when the processing time $T_3$ elapses, the deposition amount D2 reaches an amount so as to block CD2 (clogs the opening of the large holes corresponding to the pattern 6). The controller 100 adjusts the processing time T of the deposition step to a time which is equal to or longer than time $T_0$ and which is shorter than time $T_3$, so that the expressions of CD2≤2×D1 and 2×D2<CD2 are established simultaneously.

[Experimental Results]

An example of results when the above-described etching method was performed by the substrate processing apparatus 1 is described with reference to FIGS. 10A to 10E. FIGS. 10A to 10E are diagrams each illustrating an example of an experimental result when the etching method according to the present embodiment is performed. In the present experiment, the predetermined number of times in step S11 of FIG. 8 is one.

FIG. 10A is a longitudinal cross-sectional view illustrating a structure on the wafer W after the first etching step has been performed. A part of the etching film 20 is etched in the pattern 5 for the fine holes in the mask 50. In FIG. 10A, illustration of a portion of the structure on the wafer W, in which the etching film 20 is etched in the pattern 6 for the large holes of the mask 50, is omitted.

FIGS. 10B and 10C are longitudinal cross-sectional views each illustrating the structure on the wafer W after the deposition step has been performed. FIG. 10B illustrates illustration of a portion of the structure on the wafer W in which the pattern 5 for the fine holes is provided. FIG. 10O illustrates illustration of a portion of the structure on the wafer W in which the pattern 6 for the large holes is provided. In FIG. 10B, the top of the pattern 5 for the fine holes in the mask 50 is clogged by the protective film 70. On the other hand, in FIG. 10C, the protective film 70 is deposited on the upper surface and upper side walls of the pattern 6 for the large holes formed in the etching film 20, but the pattern 6 for the large holes in the mask 50 is not clogged.

FIGS. 10D and 10E are longitudinal cross-sectional views each illustrating the structure on the wafer W after the second etching step has been performed. FIG. 10D illustrates illustration of a portion of the structure on the wafer W in which the pattern 5 for the fine holes is provided. FIG. 10E illustrates illustration of a portion of the structure on the wafer W in which the pattern 6 for the large holes is provided. In FIG. 10D, the pattern 5 for the fine holes formed on the etching film 20 remains blocked by the protective film 70. Meanwhile, in FIG. 10E, because the pattern 6 for the large holes formed in the etching film 20 is open, etching of the large holes can be made up to the etching stop layer 30. During etching of the large holes, the fine holes are not over-etched because the pattern 5 for the fine holes is clogged by the protective film 70. Thus, the large holes can be etched to the etching stop layer 30 while maintaining CD of the fine holes.

As illustrated in FIGS. 10D and 10E, while performing the second etching step, it is desirable to use process conditions that allow the opening of the pattern 6 for the large holes to be maintained and that allows the opening of the pattern 5 for the fine holes to be blocked. By performing the second etching step, the protective film 70 is also somewhat etched and reduced. However, by controlling the process conditions in the second etching step, such as the flow rate of a deposition gas such as $C_4F_6$ gas, and partial pressure of $O_2$ gas, it is possible to adjust a degree of etching of the protective film 70 so that a state of the pattern 5 for the fine holes is maintained to be blocked and that the pattern 5 is not reopened.

In addition, if the second etching step is likely to re-open an opening of the pattern 5 for the fine holes by the protective film 70 being etched, the second etching step is stopped before the opening of the pattern 5 is formed. Thereafter, it is desirable to repeat the deposition step (step S5) and the second etching step (step S9).

As described above, in the etching method according to the present embodiment, when the etching film 20 is etched simultaneously into the different patterns 5 and 6 of the mask 50, by performing the first etching step, the deposition step, and the second etching step, CD of the fine holes and CD of the large holes can be controlled.

[Variations]

In the example illustrated in FIG. 4B, the etching process was performed until etching of the fine holes is stopped at the etching stop layer 40, but is not limited thereto.

(First Variation)

Figure 11A:
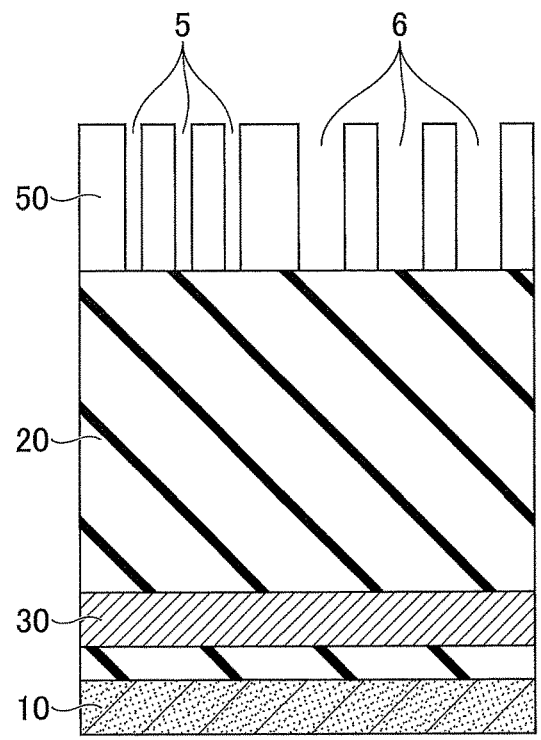
FIGS. 11A to 11D are diagrams illustrating respective steps of an etching method according to a first variation of the embodiment.

For example, as illustrated in FIG. 11A, a wafer W according to a first variation of the present embodiment has a structure in which an etching film 20 is formed under a mask 50 of a pattern 5 for fine holes and a pattern 6 for a large holes, and in which an etching stop layer 30 is formed in a lower portion of the etching film 20. In the first variation, the single etching stop layer 30 is provided at the same height below the pattern 5 for the fine holes and the pattern 6 for the large holes. Even in the configuration of the wafer W according to the first variation, the etching method having the aforementioned three steps can be used.

Figure 11B:
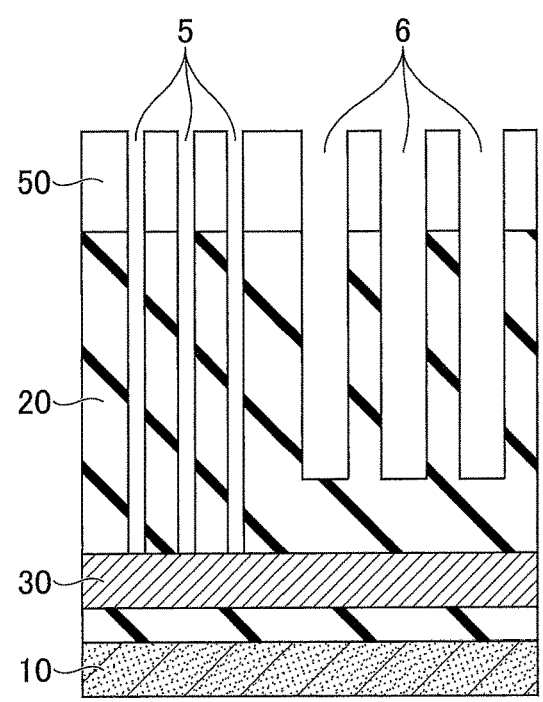

In the first variation, as illustrated in FIG. 11B, an etching rate of fine holes etched in the pattern 5 for the fine holes is higher than an etching rate of large holes etched in the pattern 6 for the large holes. Thus, in the first etching step, the fine holes reach the etching stop layer 30 earlier than the large holes. Once the fine holes reach the etching stop layer 30, the first etching step terminates.

Figure 11C:
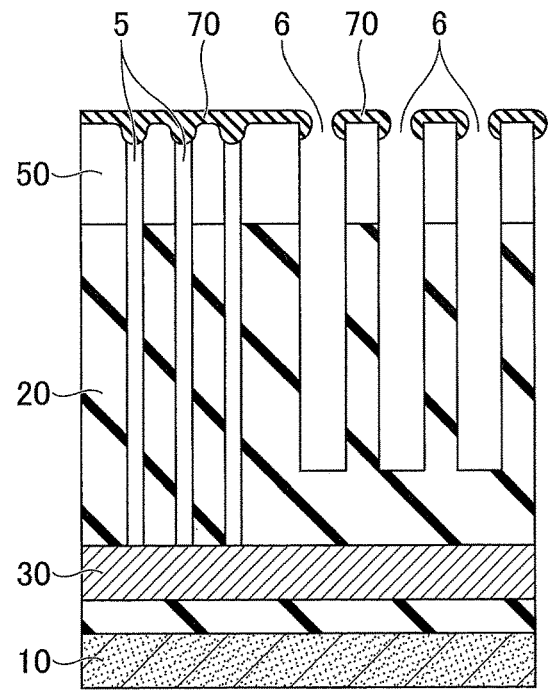

The deposition step after the first etching step controls deposition of the protective film 70 so as to clog the pattern 5 for the fine holes in the mask 50 and not to clog the pattern 6 for the large holes in the mask 50, as illustrated in FIG. 11C.

Figure 11D:
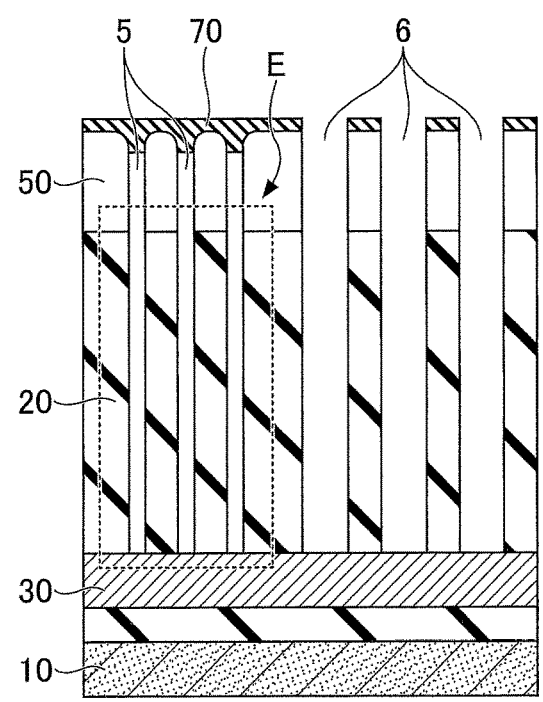

In the second etching step after the deposition step, etching is performed until the large holes reach the etching stop layer 30, as illustrated in FIG. 11D. During the second etching step, the opening of the pattern 5 for the aperture is blocked by the protective film 70. Thus, the fine holes are not over-etched, and the large holes can be etched to the etching stop layer 30 while maintaining the CD of the fine holes.

(Variation 2)

Figure 12A:
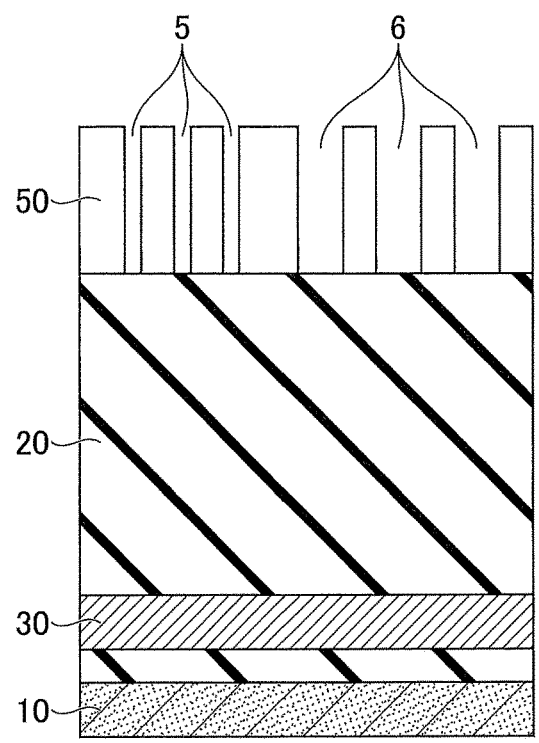
FIGS. 12A to 12D are diagrams illustrating respective steps of an etching method according to a second variation of the embodiment.

In a second variation of the present embodiment, target etching depth (depth of a hole to be etched) is different between fine holes and large holes. As illustrated in FIG. 12A, because a structure of a wafer W according to the second variation is the same as that according to the first variation illustrated in FIG. 11A, the description thereof will not be repeated here.

Figure 12B:
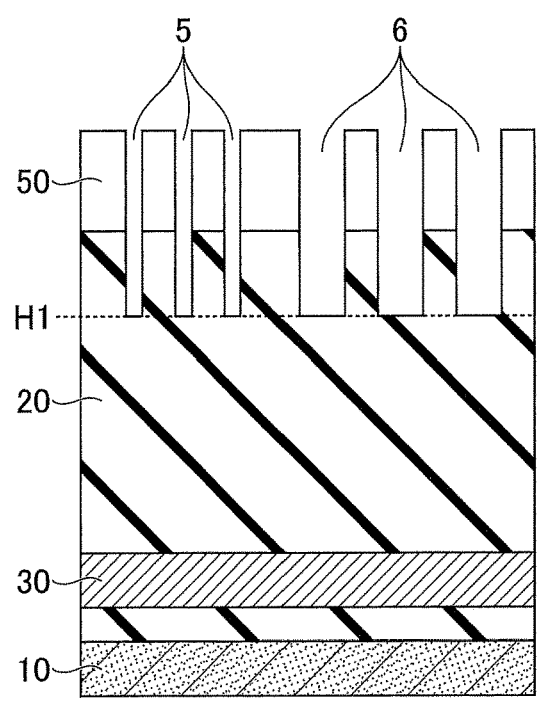

In the second variation, as illustrated in FIG. 12B, the etching rate of the fine holes etched into the pattern 5 for the fine holes is the same as the etching rate of the large holes etched into the pattern 6 for the large holes. Thus, when the first etching step is completed, depth of the fine holes and depth of the large holes become the same (H1).

Figure 12C:
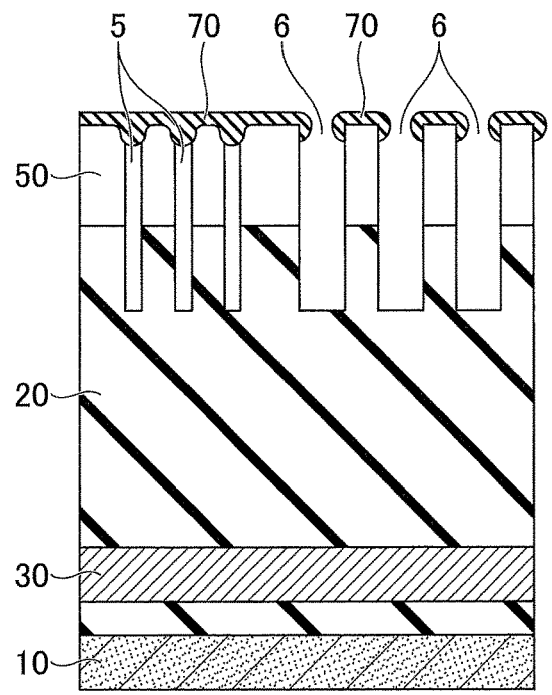

In the deposition step after the first etching step, the protective film 70 is formed so as to clog the pattern 5 for the fine holes in the mask 50 and not to clog the pattern 6 for the large holes, as illustrated in FIG. 12C.

Figure 12D:
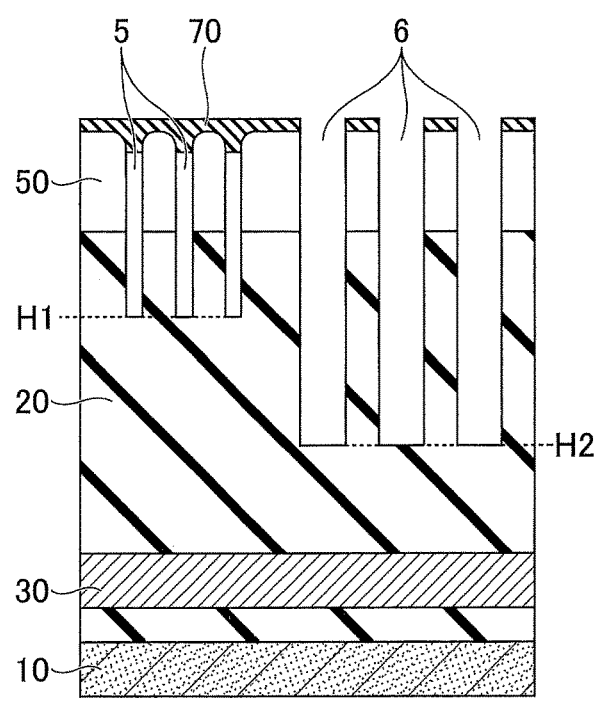

In the second etching step after the deposition step, the large hole is etched to a depth H2 before reaching the etching stop layer 30, as illustrated in FIG. 12D. The opening of the pattern 5 for the fine holes is clogged by the protective film 70. Thus, the fine holes are not over-etched, and the large holes can be etched to a predetermined depth H2 while maintaining CD of the fine holes having the depth H1. In the second variation, the etching stop layer 30 is not necessary.

That is, the etching method described above can also be used to etch an etching film 20 not having an etching stop layer.

As described above, in the etching method according to the first and second variations, when the etching film 20 is etched simultaneously into the different patterns 5 and 6 of the mask 50, by performing the first etching step, the deposition step, and the second etching step, CD of the fine holes and CD of the large holes can be controlled.

[Processing System]

The first etching step, the deposition step, and the second etching step performed by the etching method according to the above-described embodiment and variations 1 and 2 may be performed without breaking the vacuum and being exposed to the atmosphere, that is, maintaining the vacuum. In order to perform the aforementioned method in a state in which a wafer is not exposed to the atmosphere, the method may be carried out in the same chamber or in the same processing system (in-Situ). However, the first etching step, the deposition step, and the second etching step may be performed in different chambers.

Productivity is increased by performing the first etching step, the deposition step, and the second etching step in the same chamber or in the same processing system while maintaining a vacuum without exposing a wafer to the atmosphere. In addition, influence of atmospheric moisture on process characteristics can be reduced.

In a case in which the first etching step, the deposition step, and the second etching step are performed in the same chamber, the first etching step, the deposition step, and the second etching step may be performed in the chamber 2 of the substrate processing apparatus 1 in FIG. 1. However, the etching method according to the present embodiment is not limited thereto. The etching method may be performed on any of the following types of substrate processing apparatus: a capacity coupled plasma (CCP) type, an inductively coupled plasma (ICP) type, a radial line slot antenna (RLSA) type, an electron cyclotron resonance plasma (ECR) type, and a helicon wave plasma (HWP) type.

Figure 13:
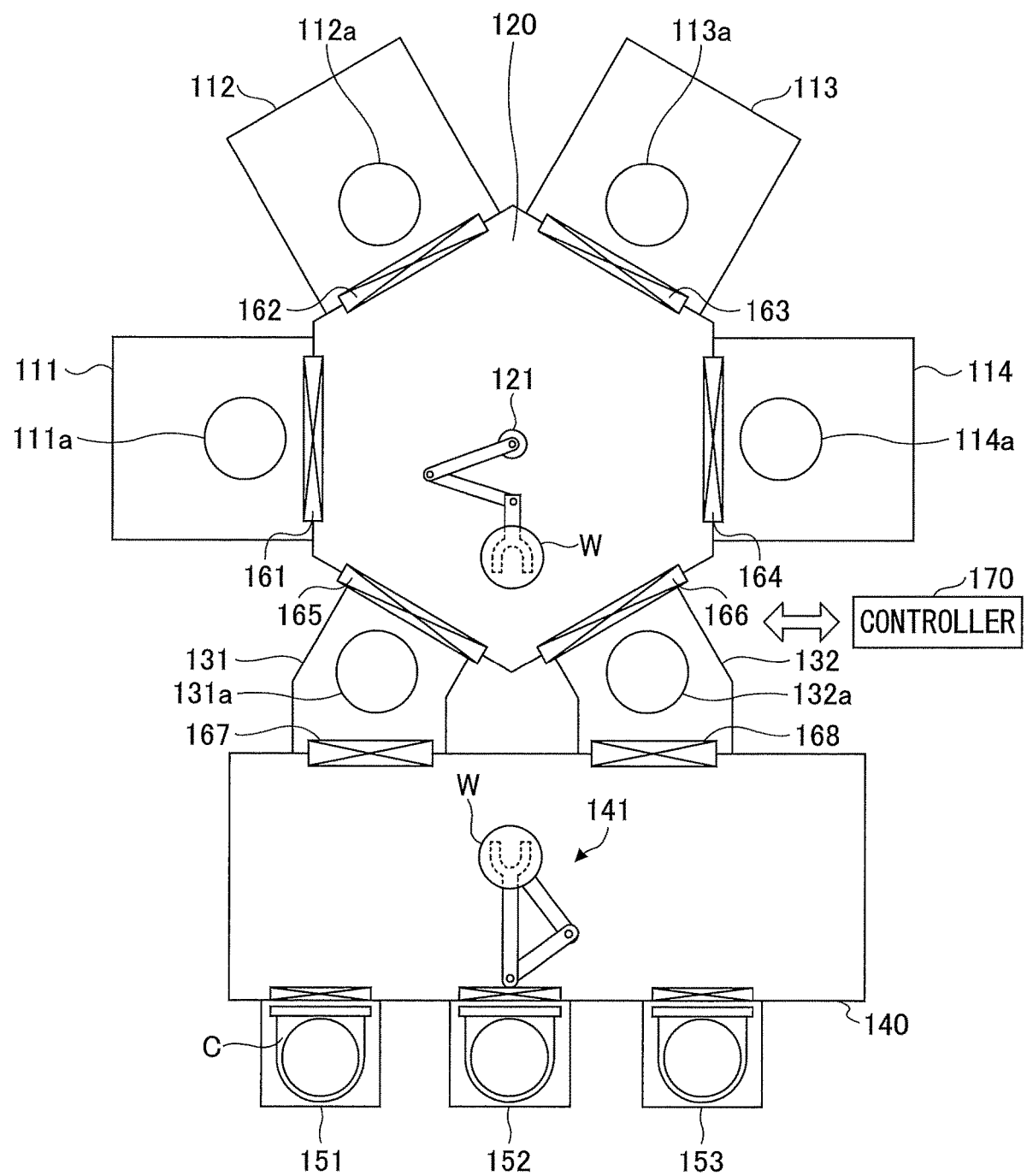
FIG. 13 is a plan view illustrating an example of a processing system according to the embodiment.

In a case in which the first etching step, the deposition step, and the second etching step are performed in the same processing system, the first etching step, the deposition step, and the second etching step may be performed in a processing system illustrated in FIG. 13. The processing system includes process chambers 111 to 114, a vacuum transport chamber 120, load-lock chambers 131 and 132, an atmospheric transport chamber 140, load ports 151 to 153, gate valves 161 to 168, and a controller 170.

The process chambers 111 to 114 respectively include stages 111a to 114a on which wafers W are disposed, and are connected to the vacuum transport chamber 120 via the gate valves 161 to 164. The process chambers 111 to 114 are decompressed to a predetermined vacuum atmosphere, in which desired processes (such as the first etching step, the deposition step, the second etching step, and ashing process) are applied to the wafers W.

The vacuum transport chamber 120 is depressurized to a predetermined vacuum atmosphere. The vacuum transport chamber 120 is equipped with a transport mechanism 121. The transport mechanism 121 conveys the wafer W to the process chambers 111 to 114 and the load-lock chambers 131 and 132.

The load-lock chambers 131 and 132 respectively include stages 131a and 132a on which the wafers W are disposed, are connected to the vacuum transport chamber 120 via the gate valves 165 and 166 respectively, and are connected to the atmospheric transport chamber 140 via the gate valves 167 and 168 respectively. The load-lock chambers 131 and 132 provide a function to switch between atmospheric and vacuum atmospheres.

The atmospheric atmosphere is formed in the atmospheric transport chamber 140, and a transport mechanism 141 is provided in the atmospheric transport chamber 140. The transport mechanism 141 conveys the wafer W to the load-lock chambers 131 and 132 and to carriers C of the load ports 151 to 153. To the load ports 151 to 153, a carrier C in which a wafer W is stored or an empty carrier C is attached.

The controller 170 controls an entirety of the processing system, by performing operations of the process chambers 111 to 114, operations of the transport mechanisms 121 and 141, opening and closing operations of the gate valves 161 to 168, and switching of the vacuum or atmospheric atmosphere within the load-lock chambers 131 and 132.

According to the processing system illustrated in FIG. 13, an etching process related to the first etching step may be performed in any one of the process chambers 111 to 114, and a protective film forming process related to the deposition step may be performed in a process chamber different from that in which the first etching step is performed. The second etching step may be performed in a process chamber other than the process chamber in which the deposition step is performed, and in a process chamber in which the first etching step is performed or a process chamber other than the process chamber in which the first etching step is performed. According to the processing system, while a wafer W is subjected to the first etching step, the deposition step, and the second etching step, the wafer W can be subjected to predetermined processing without exposing the wafer W to the atmosphere, i.e., without breaking the vacuum.

In a case in which the first etching step, the deposition step, and the second etching step are to be carried out in the same chamber, the three steps may be carried out in any one of the process chambers 111 to 114.

In a case in which the first etching step, the deposition step, and the second etching step are performed in different chambers, the first etching step and the second etching step may be performed in any chambers of the process chambers 111 to 114 respectively, and the wafer W may be transferred to a CVD (Chemical Vapor Deposition) device other than the process chambers 111 to 114 to perform the deposition step in the CVD device.

The etching method and the substrate processing apparatus 1 according to the embodiment and the variations of the embodiment have been described. In the etching method according to the embodiment, as illustrated in FIGS. 4A to 4D, the wafer W may have a first underlayer (first underlying film) and a second underlayer (second underlying film), in or under the etching film 20. In the example of FIGS. 4A to 4D, the first and second underlayers are separate etching stop layers.

The first underlayer is below the pattern 5 that is an example of the pattern of the recess of the first opening, and the second underlayer is below the pattern 6 that is an example of the pattern of the recess of the second opening. Thickness of the etching film 20 between a bottom of the pattern of the recess of the first opening and the first underlayer is less than thickness of the etching film 20 between a bottom of the pattern of the recess of the second opening and the second underlayer. Etching depth of the etching film 20 etched in the pattern of the recess of the first opening is less than thickness of the etching film 20 between the bottom of the pattern of the recess of the second opening and the second underlayer.

In the etching method according to the variations of the embodiment, as illustrated in FIGS. 11A to 12D, the wafer W may have a first and a second underlayer in or under the etching film 20. In the example of FIGS. 11A to 12D, the first and second underlayers are etch-stop layers, and may be an integrated film.

The wafer W includes the first underlayer and the second underlayer in or under the etching film 20, wherein the first underlayer is under the pattern 5 that is an example of the pattern of the recess of the first opening, and the second underlayer is under the pattern 6 that is an example of the pattern of the recess of the second opening. Thickness of the etching film 20 between the bottom of the pattern of the recess of the first opening and the first underlayer is the same as thickness of the etching film 20 between the bottom of the pattern of the recess of the second opening and the second underlayer.

Etching depth of the etching film 20 etched in the pattern of the recess of the first opening may be the same as thickness of the etching film 20 between the bottom of the pattern of the recess of the second opening and the second underlayer, as illustrated in FIGS. 11A to 11D. Alternatively, as illustrated in FIGS. 12A to 12D, the etching depth of the etching film 20 etched in the pattern of the recess of the first opening may be different from the thickness of the etching film 20 between the bottom of the pattern of the recess of the second opening and the second underlayer.

The etching method and the substrate processing apparatus according to the embodiment and its variations disclosed herein are to be considered exemplary in all respects and not limiting. The above-described embodiment and the variations 1 and 2 can be modified and enhanced in various forms without departing from the appended claims and spirit thereof. Matters described in the above embodiment and its variations may take other configurations to the extent not inconsistent, and may be combined to the extent not inconsistent.

The present specification has described a wafer W as an example of a substrate. However, the substrate is not limited thereto, and may be various substrates used in an FPD (Flat Panel Display), a printed circuit board, or the like.

What is claimed is:

1. A method of etching a substrate including an etching film and a mask formed on the etching film, the mask including a first pattern of a first recess having a first opening and a second pattern of a second recess having a second opening, the method comprising:
   a) etching the etching film to a predetermined depth;
   b) depositing a protective film on the mask after a); and
   c) etching the etching film after b); wherein
      the first opening is smaller than the second opening, and
      as a result of performing b), the first opening of the first pattern is clogged and the second opening of the second pattern is not clogged.

2. The method according to claim 1, wherein, in c), the etching film is etched in the second pattern of the second recess of the second opening while the first opening of the first pattern is clogged.

3. The method according to claim 1, wherein in b), the protective film is deposited such that a deposition amount (D) of the protective film deposited on a side wall of the first pattern and a side wall of the second pattern satisfies an inequality of $CD1 \leq 2 \times D < CD2$, wherein CD1 is a diameter or width of the first recess, and CD2 is a diameter or width of the second recess.

4. The method according to claim 1, wherein in b), the protective film is deposited such that a deposition amount (D1) of the protective film deposited on a side wall of the first pattern and a deposition amount (D2) of the protective film deposited on a side wall of the second pattern satisfy inequalities of $$CD1 \leq 2 \times D1 \text{ and}$$

$$2 \times D2 < CD2,$$

wherein CD1 is a diameter or width of the first recess, and CD2 is a diameter or width of the second recess.

5. The method according to claim 1, wherein in b), an amount of the protective film deposited on a bottom of a recess of the etching film corresponding to the second pattern is less than an amount of the protective film deposited on an upper surface or an upper side wall of the second pattern.

6. The method according to claim 1, wherein in b), a shape of the protective film deposited on a side wall of the first pattern and on a side wall of the second pattern is an overhung shape.

7. The method according to claim 1, further comprising:
d) repeating b) and c) at least once.

8. The method according to claim 1, wherein the predetermined depth is etching depth of a recess formed in the etching film that is etched in accordance with the first pattern.

9. The method according to claim 1, wherein the substrate further includes a first underlayer and a second underlayer in the etching film, the first underlayer is below the first pattern, the second underlayer is below the second pattern, and a thickness of the etching film between a bottom of the first pattern and the first underlayer is less than a thickness of the etching film between a bottom of the second pattern and the second underlayer.

10. The method according to claim 9, wherein etching depth of the etching film etched in the first pattern is less than the thickness of the etching film between the bottom of the second pattern and the second underlayer.

11. The method according to claim 1, wherein
the substrate further includes a first underlayer and a second underlayer in the etching film,
the first underlayer is below the first pattern,
the second underlayer is below the second pattern, and
a thickness of the etching film between a bottom of the first pattern and the first underlayer is equal to a thickness of the etching film between a bottom of the second pattern and the second underlayer.

12. The method according to claim 11, wherein etching depth of the etching film etched in the first pattern is equal to the thickness of the etching film between the bottom of the second pattern and the second underlayer.

13. The method according to claim 11, wherein etching depth of the etching film etched in the first pattern is different from the thickness of the etching film between the bottom of the second pattern and the second underlayer.

14. The method according to claim 9, wherein the first underlayer and the second underlayer are etching stop layers.

15. The method according to claim 1, wherein the protective film deposited in b) has selectivity with respect to the etching film.

16. The method according to claim 1, wherein a), b), and c) are performed without exposing the substrate to air.

17. The method according to claim 16, wherein a), b), and c) are performed in a same chamber or in a same processing system.

* * * * *